United States Patent [19]
Jousse et al.

[11] Patent Number: 5,288,527
[45] Date of Patent: Feb. 22, 1994

[54] SILICON NITRIDE THIN FILMS WITH IMPROVED PROPERTIES

[75] Inventors: Didier Jousse, St Leu; Pablo Vilato, Paris; Jean-Claude Bruyere, Venon; Brigette Reynes, Fontaine, all of France

[73] Assignee: Saint Gobain Vitrage International c/o Saint Gobain Recherche, Aubervilliers Cedex, France

[21] Appl. No.: 795,383

[22] Filed: Nov. 21, 1991

[51] Int. Cl.⁵ .............................. B05D 3/06; B05D 5/12
[52] U.S. Cl. ..................................... 427/579; 427/573; 427/574; 437/195; 437/190; 437/241
[58] Field of Search ................ 427/579, 573, 574; 437/241, 190, 195

[56] References Cited

U.S. PATENT DOCUMENTS

| | | | |
|---|---|---|---|
| 4,066,037 | 1/1978 | Jacob | 427/569 |
| 4,091,407 | 5/1978 | Williams et al. | 437/241 |
| 4,618,541 | 10/1986 | Forouhi et al. | 427/579 |
| 4,624,737 | 11/1986 | Shimbo et al. | 437/195 |
| 4,692,344 | 9/1987 | Kaganowicz et al. | 427/579 |
| 4,786,612 | 11/1988 | Yau et al. | 437/241 |
| 4,895,734 | 1/1990 | Yoshida et al. | 427/579 |
| 4,908,333 | 3/1990 | Shimokawa et al. | 437/241 |
| 5,041,303 | 8/1991 | Wertheimer et al. | 427/579 |

Primary Examiner—Marianne Padgett
Attorney, Agent, or Firm—Oblon, Spivak, McClelland, Maier & Neustadt

[57] ABSTRACT

A method for preparing silicon nitride films with improved properties and characterized by a limited concentration of hydrogen atoms, a high index of refraction, resistance to attack by a hydrofluoric solution, prevention of diffusion of alkalines and oxygen, and good dielectric properties such as optical gap. The process of preparation uses plasma CVD with ammonia. The invention can be applicable to flat screens, TFT transistors and functional glazings.

8 Claims, 2 Drawing Sheets

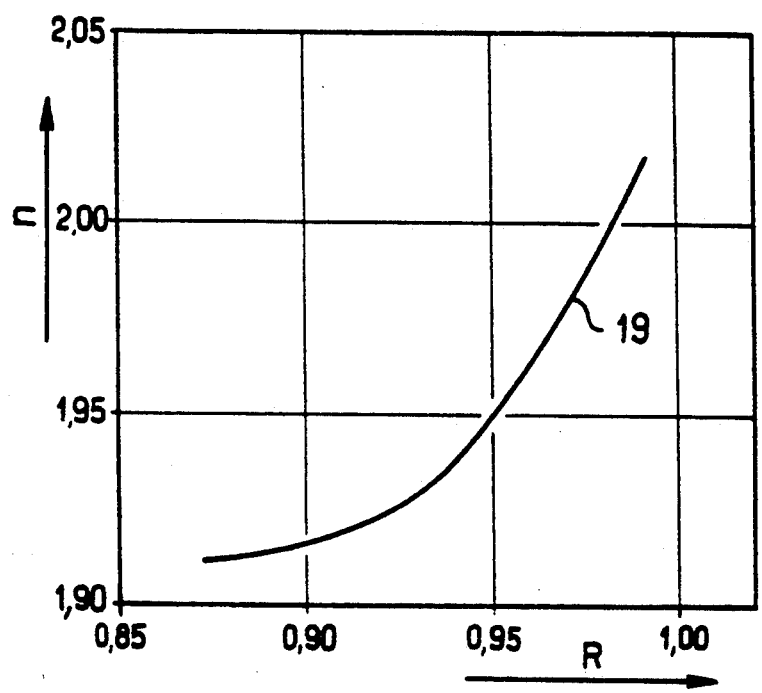
FIG_3

SILICON NITRIDE THIN FILMS WITH IMPROVED PROPERTIES

BACKGROUND OF THE INVENTION

1. FIELD OF THE INVENTION

The invention relates generally to the technical field of silicon nitride thin films and their applications, and more particularly to a technique for industrial preparation of silicon nitride films with performances that are considerably improved relative to the prior art.

2. DESCRIPTION OF RELATED ART

Silicon nitride thin films are known. They find uses in electronics, in particular for the passivation of integrated circuits and as insulating films in thin film transistors (TFT), such as those of flat screens. The technique most generally used for their preparation is chemical vapor phase deposition at low pressure and with a plasma (CVD under plasma). The chemical types introduced in the plasma are, among others, nitrogen ($N_2$) and silane ($SiH_4$) optionally diluted in helium (He). The frequencies of the plasma-generating electric fields are most commonly 13.56 MHz.

The performances of the silicon nitride films which are desired relate to several criteria, which include their composition, their density, their resistance to etching and their role as a barrier against the diffusion of oxygen and alkalines. Their structure is often characterized by the index of refraction and it is desired that the index be as close as possible to the index of the solid $Si_3N_4$.

The technical problem that the invention trys to solve is to provide a method for industrial production of silicon nitride films with improved performances, and in particular according to the the preceding criteria.

The silicon nitride films used in electronics play a role, not only during the operation of the finished device, for example, as an insulating film between two active films (grid insulating material of a TFT) but they also play a very important role during the production of the device itself. This role is that of a protective film. The production techniques of thin-film transistors, such as those which constitute the nodes that are found at each pixel of a flat screen are actually very violent, such as high-temperature heat treatments and etching with hydrofluoric acid. During these operations, silicon nitride thin films are expected to play the role of impassable barriers either to mark preferred zones that are not desired to be attacked or to avoid during heating, the degradation of the amorphous or polycrystalline silicon that they are supposed to protect. It would even be desirable for the silicon nitride films to act as a barrier against the diffusion of alkaline ions, which would allow their use as an encapsulating film for a glass substrate.

The techniques used to produce the silicon nitride thin films are usually those of CVD under plasma. Such a technique is described, for example, in the publication "Plasma-enhanced CVD of high quality insulating films" by J. BATEY et al. in Applied Surface Science 39 (1989), 1-15 North-Holland, Amsterdam. The deposition is performed from a gas which is a mixture of $SiH_4$ diluted in helium (2%) and nitrogen in close proportions, this mixture itself being further diluted in helium (from 20 to 60 times). The gas circulates in an enclosure between two plane electrodes separated by several cm where the pressure is about 130 Pa, and subjected to an alternating electric field of 13.56 Mhz with a power density on the order of 20 mw/cm$^2$. A substrate, with a monocrystalline silicon base, for example, optionally provided with other thin films, is heated up to temperatures of 350° C. and silicon nitride is formed at its surface.

A method using the same technique with a gas mixture containing ammonia with a frequency of 50 Khz is also described in: "W. A. P. CLAASSEN, Ion Bombardment-induced Mechanical Stress in Plasma Enhanced Deposited Silicon Nitride and Silicon Oxynitride Films, Plasma Chemistry and Plasma Processing 7 (1987) March, no. 1, Bristol G. B."

A different method using the electron cyclotron resonance plasma CVD (ECR plasma CVD) is described by Y. MANABE and T. MITSUYU in "Journal of Applied Physics 66 (1989), Sep. 15, no. 6." This technique makes it possible to obtain silicon nitride films that are very high-performing but under specific laboratory conditions and which make the application limited to small dimensions.

To test the performances of silicon nitride thin films, two test methods are used in particular: hydrofluoric attack and SIMS analysis of the film after the diffusion test. The first method consists in measuring the thickness of the film as it evolves over time during a retention in a bath consisting of an aqueous solution at 35% by volume of $NH_4F$ and 6% of HF. The bath is thermostated at 28° C. A rate of attack expressed in nanometers per minute is deduced from the thickness measurements. With the films whose preparation has been described above, the rates of attack are on the order of 5 nm/mn.

The second method relates to a SIMS analysis of the original film as it is immediately after its deposition on a substrate where the alkaline ions become mobile when the temperature rises such as, for example, on the soda-lime-silica glass and an analysis of a similar film after it has undergone a heat treatment at 600° C. for an hour under a nitrogen atmosphere. The test consists in comparing the concentration profiles of the alkaline ion—in this case, sodium—before and after the treatment to see if the diffusion has occurred or not. With the usual barrier films, especially those with a silicon oxide base, a certain diffusion is noted.

SUMMARY OF THE INVENTION

Accordingly, one object of the invention is to provide a novel method for preparing silicon nitride films. Another object of the invention is to provide a method for industrial production of silicon nitride thin films with improved properties. Another object of the invention is to provide silicon nitride films with improved properties for electronic and structural applications.

The present invention comprises a process for the production of silicon nitride thin films by CVD under plasma from a gas mixture of $SiH_4$ and $N_2$ in helium in the presence of an alternating field of frequency lower than 1 MHz and where ammonia gas is introduced in the plasma, so that a ratio R of the nitrogen flow to the sum of the flows of ammonia and nitrogen is greater than 0.80 and less than 1.00.

Advantageously, this ratio R is between 0.97 and 0.99, since it then provides a film with an index of refraction greater than 1.97.

To obtain a silicon nitride film with an optical gap greater than 5 eV, a ratio R between 0.80 and 0.97 is selected.

In the process of the invention, the temperature of the substrate is advantageously less than 400° C. and the proportion of $SiH_4$ relative to the helium is less than 5%. Likewise, the frequency is preferably between 10 and 400 KHz, and advantageously, 50 kHz.

The invention also provides for the application of silicon nitride films deposited on a glass substrate according to the same process for the production of barriers preventing the diffusion of alkalines outside the glass as well as to the production of electroluminescent or liquid crystal screens and to that of flat screens to avoid the attack of the glass during the engraving of TFT transistors.

According to the invention, the silicon nitride films are applied to the composition of grid insulating material of TFT transistors.

For flat screens production, the films of the invention are applied to the preparation of the glass to make it suitable for the deposition of amorphous or polycrystalline silicon.

In the field of the building industry, the films of the invention are used for the production of functional glazings. In this case, silicon nitride plays the role of a protective film to avoid chemical and mechanical attack of the functional films deposited on the glass. For example such films are applied to flat glass for windows. Further, when the thickness of the silicon nitride film is such that it plays an interferential role, it makes it possible to obtain an additional optical effect on transmission and reflection.

The films obtained by the process of the invention exhibit, relative to the silicon nitride films obtained by plasma CVD, an appreciable improvement in performance. It thus is noted that the index approximates that of solid silicon nitride $Si_3N_4$. The specialists see there the proof that the film is particularly homogeneous, without gaps. Such a film is therefore suitable to be used for a barrier against the attack of solvents intended to make other materials disappear.

Thus, a film of $Si_3N_4$ according to the invention can, when it is deposited on a film of amorphous silicon, prevent, in the places where it is exists, the usual hydrofluoric buffer solution from coming into contact with the silicon while in adjacent exposed silicon regions, the attack will make the amorphous silicon disappear completely.

Likewise, in order to produce a selective engraving of the substrate at certain well-determined places such as, for example, to produce digital optical disks or matrices of CD video disks, the $Si_3N_4$ thin film according to the invention makes possible the use of the so-called "lift off" technique. In this technique, contacts with photosensitive resin placed at locations to be engraved are covered at the same time as the rest of the surface by the film of the invention, and the resin is then dissolved by leaving the $Si_3N_4$ protection on the rest of the surface. In the following operation, the engraving is performed on the places thus cleared.

Also, the well-known antidiffusion properties of the silicon nitride thin films, both for oxygen and for alkaline ions, is obtainable with the films of the invention. This is due to their absence of gaps shown by the conformity of the index of the film to that of the solid nitride, and therefore constitute continuous barriers against the diffusion of the concerned elements.

The possibility offered by the technique of the invention of producing samples or a very large dimension and the good control of the index of refraction of the films obtained also offer an important advantage in the case of functional films deposited on the flat glass intended to produce architectural or automobile glazings. Actually, such films with an index find their use as interferential films to give the glazing a definite coloring or on the contrary, to eliminate an undesirable coloring—iridescence, for example. In these cases, it is essential that the optical thickness of the film, the product of its index per its geometric thickness, is as constant as possible, which the invention makes possible to attain thanks to the control of the index. It is then sufficient to keep the thickness constant, which is the usual practice in the case of functional films for glazings.

On the other hand, the large optical "gaps" of the films of the invention make it possible for them to find very advantageous applications in various fields of electronics. This is because they constitute, thanks to this characteristic, a dielectric of very good quality. In the field of pure optics, their low absorption makes them able to constitute excellent interferential films, even with great thickness.

Concerning the use of silicon nitride films on glass substrates, the deposition techniques existing before this invention virtually excluded it. Actually, the conventional CVD, using temperatures on the order of 750° C. was incompatible with many glass substrates unusable at these temperatures and further, the mobility of the alkaline ions in this thermal range caused a significant diffusion of the alkalines in the film itself. The other techniques, using the CVD under plasma at 13.56 MHz, limited the dimensions of the substrates on which the deposition would have been sufficiently uniform. It is the same for so-called ECR plasma CVD techniques. Finally, the limited transparency of the silicon nitrides obtained previously limited their field of application on the glass substrates.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 shows the evolution of the index of refraction of the film as a function of the composition of the gas mixture introduced.

DESCRIPTION OF PREFERRED EMBODIMENTS

Figure 1:
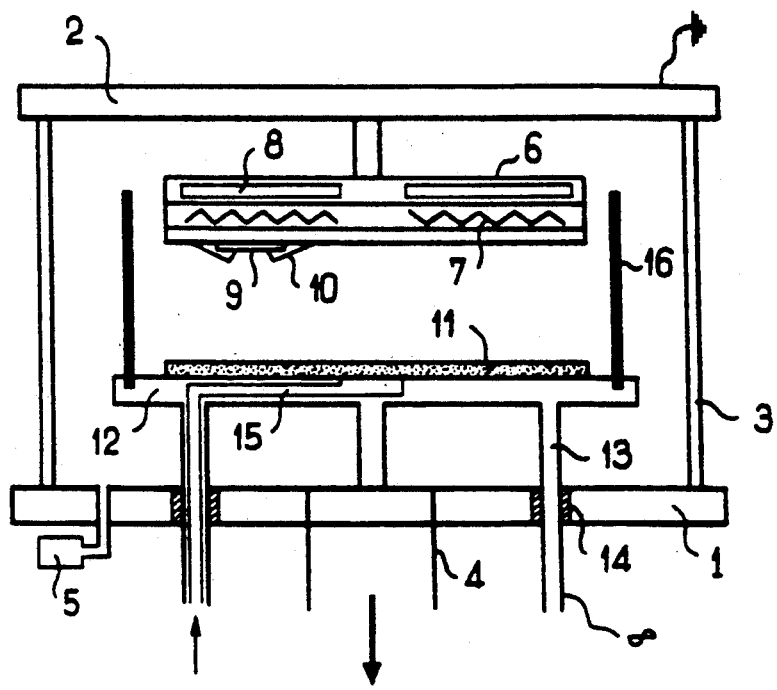
FIG. 1 exhibits a diagrammatic view of the installation of CVD under plasma.

To produce the films of the invention, a standard installation of CVD under plasma is used, such as the one shown, for example, in FIG. 1. There is seen a frame consisting of two circular metal plates 1, 2 which constitute the bases of a cylinder 3 of borosilicate glass. The inside of the cylinder is connected by duct 4 to a pumping system, not shown. The pressure in the enclosure is controlled thanks to Pirani vacuum gage 5. In the enclosure, an upper electrode 6 is seen which is, like the frame itself, grounded. This electrode is equipped with systems of heating 7 and cooling 8 as well as thermocouples, not shown. The unit makes it possible to adjust the temperature with a ±2° C. precision. This electrode is used for support for sample 9 attached by clamps 10 to its lower surface. Another electrode 11, parallel to and of the same dimensions (diameter 200 mm) as the first one is made of porous stainless steel. It is carried by a plate 12 itself supported by rods 13 going through the frame by insulating seals 14. The alternating voltage is applied on one of these rods. Another rod is arranged to make possible the passage from a pipe 15 by which the plasma-generating gases will be introduced and brought up to porous electrode 11. Plate 12 supports a cylinder 16 of fused silica.

During tests, the distance between electrodes 6 and 11 was 30 mm.

The process of the invention consists first in placing a substrate at 9. It is, for example, a slab of monocrystalline silicon or a soda-lime-silica glass plate. Then degassing the installation is performed by providing a primary vacuum, then a secondary vacuum, to be created for several tens of minutes during which the temperature of the sample is allowed to stabilize to the set value. The mixture of the helium, silane, nitrogen and ammonia gases in the desired proportions is then introduced through porous electrode 11 and the pressure is allowed to be established at the value of 115 Pa. The electric field is then applied. The optimal conditions selected were a frequency of 50 kHz and a surface power of 60 milliwatts per square centimeter.

Once the deposition is performed, the enclosure is linked with the atmosphere, the sample is taken out and the evaluation of the deposited film is performed. The measured parameters are the thickness and the index of refraction of the film, the rate of attack by buffered acid medium, the content of the film in hydrogen atoms and finally the standard spectrophotometric measurements. The thickness and the index are measured by ellipsometry with an He-Ne laser at 632.8 nm of wavelength.

The acid attack is conventionally performed in a bath thermostated at 28° C. and comprising a mixture respectively of 7 volumes to 1 volume of $NH_4F$ at 40% in water with HF at 50%. The sample is allowed to stay for a given time in the bath, and its thickness is measured at the end of each treatment. The rate of attack is thus deduced. In regard to the hydrogen content, it is deduced from the infrared measurement in the Si—H and Si—N bonds, corroborated by the direct determination of the hydrogen concentration thanks to nuclear measurements. The method used is that described in "quantitative IR characterization of PE-CVD Silicon oxinitride films" by ROSTAING et al. in : Intern. Conference on Amorphous and Liquid Science, Prague, August 1987. The calculation provides the number of hydrogen atoms per $cm^3$ of the film.

It should be noted that the hydrogen contents used have meaning only if reference is made to films as they have been produced, i.e., to "approximately stoichiometric" films. Films are thereby meant whose ratio of the number of nitrogen atoms to that of silicon atoms is between 1.33 and 1.50 ($Si_3N_4$: ratio=1.33).

The examples will make it possible to follow in detail the phases of the process.

EXAMPLE 1

The substrate on which the deposition was made was a borosilicate glass. The three gases introduced in the enclosure were silane ($SiH_4$) diluted in helium (at 1% by volume), nitrogen and ammonia, both pure. In this example as in all the others, the ratio of the flows of the two gases $N_2+NH_3$ to that of $SiH_4$ is set at 20. The parameter that varies is ratio R. R is defined by:

$$R = \frac{\text{flow of } N_2}{\text{flow of } N_2 + \text{flow of } NH_3}$$

Here, it is 0.96.

The total flow of the gases is 132 $cm^3$/mn (reduced to standard temperature and pressure conditions—STP) The pressure is stabilized at 115 Pa. The temperature of the substrate is 350° C.

The results are as follows:
Thickness : 132 nm
Index : 2.02
Rate of attack : 3 nm/mn
Rate H : $1.03 \times 10^{22}/cm^3$.

These results are clearly better than those of prior films. In particular, the sample is subjected to a heat treatment at 600° C. in neutral atmosphere for one hour. The SIMS analyses made before and after the treatment show the absence of diffusion of the sodium in the film.

EXAMPLE 2

The substrate here also is of borosilicate glass and the conditions are identical with those of example 1 with the exception of ratio R which was 0.87 here.

The film obtained with a thickness of 350 nm, its index is satisfactory (1.91) but its rate of attack is clearly poorer than that in example 1 with 30 nm/mn.

Infrared measurements have also been made on the sample. The hydrogen ratio obtained was $1.09 \times 10^{22}/cm^3$.

EXAMPLE 3

The deposition is made here on a silica glass sample. The temperature is 350° C., the pressure is 115 Pa. The selected flows provide ratio R:

$R = 0.95.$

Figure 2:
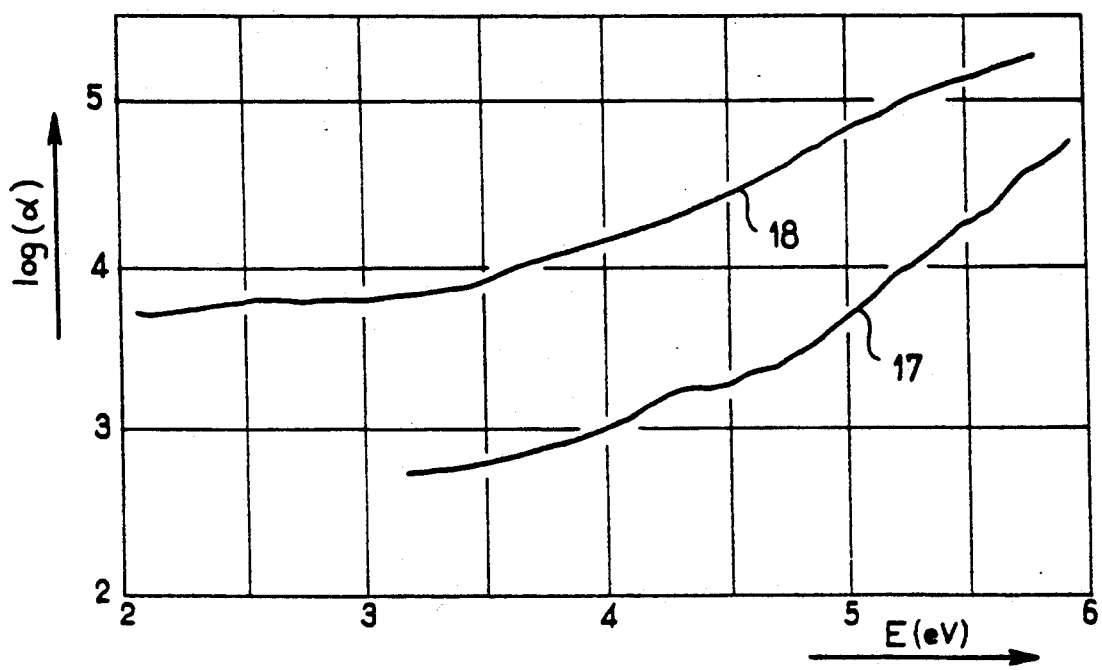
FIG. 2 represents the evolution of the optical absorption coefficient as a function of the energy for two films, one according to the invention and the other outside the domain of its process.

The thickness obtained was 610 nm and the index was 1.97. The rate of attack was determined at 8 nm/mn, in regard to the hydrogen ratio that was calculated, it was $1.13 \times 10^{22}$ atoms/$cm^3$. The sample of example 3 was measured optically and the results of the film are represented in FIG. 2. The variation of the logarithm of the absorption coefficient is seen at 17 as a function of the energy in electron volts.

The calculation which makes it possible to determine the "optical gap" (see for example: N. F. MOTT and E. A. DAVIS: "Electronic processes in noncrystalline solids," Oxford Clarendon Press, 2nd edition, 1979) in the amorphous materials is subjected, moreover, to the results of these measurements, the film of example 3 provides an optical gap of 5.4 electron volts.

The appearance of curve 17 and this value show the exceptional quality of the material obtained. Used as a dielectric in a TFT transistor, excellent performances can be expected from it. Also, this film placed at the surface of a functional flat glazing intended for architecture or for automobiles will make it play a pure interferential film role which does not at all denature the color obtained even in significant thicknesses. Actually, its characteristic coloring is virtually nonexistent.

EXAMPLE 4

Ratio R is 1 here (absence of ammonia), otherwise, the conditions are the same as in example 3.

A film of 180 nm of thickness, with an index of 2.03, is obtained. The rate of attack is 1.3 nm/mn. The optical properties are represented by curve 18, FIG. 2. They are clearly poorer than in example 3. The calculation of the optical gap confirms it, it is only 4.1 eV.

The hydrogen ratio was $0.86 \times 10^{22}/cm^3$.

The characteristics of the four samples exhibited are summarized in table I.

TABLE I

| No. | R | Ratio (cm$^{-3}$) | H | Ep (nm) | Rate of attack (nm/mn) | Opt. gap (ev) | Index |
|---|---|---|---|---|---|---|---|
| 1 | 0.96 | 1.03 | $10^{22}$ | 132 | 3 | — | 2.02 |
| 2 | 0.87 | 1.09 | $10^{22}$ | 350 | 30 | — | 1.91 |
| 3 | 0.95 | 1.13 | $10^{22}$ | 610 | 8 | 5.4 | 1.97 |
| 4 | 1 | 0.86 | $10^{22}$ | 180 | 1.3 | 4.1 | 2.03 |

Complementary tests performed by replacing NH$_3$ in the gas mixture by equivalent amounts of H$_2$ lead to results close to those where R=1.

FIG. 3 shows the decisive influence of ratio R on the index of refraction of the film obtained. Curve 19 has a positive slope when R increases. This proves that the small proportions of NH$_3$ make it possible to obtain nonporous films. However, the results of the optical gap have shown that the total disappearance of NH$_3$ in the gas mixture led to less high-performing dielectrics. The development of the production conditions on the industrial line will make it possible for one skilled in the art to find the optimal operating point to obtain the desired result, which will depend on the function that the film is to perform. If the film is to be used for a screen against diffusion (O$_2$, Na+), an effort will be made to be put under the conditions which provide the closest index of solid Si$_3$N$_4$ (those of example 1, in particular) and also if a low rate of attack is desired to be obtained. If, on the contrary, optical or dielectric properties are sought, the conditions of example 3 will be approached.

What is claimed and desired to be secured by letters patent of the United States is:

1. A process for the production of a silicon nitride film by a chemical vapor deposition, comprising the steps of:
    generating a plasma from a gas mixture of SiH$_4$ and N$_2$ in helium in the presence of an alternating field having a frequency less than 1 MHz; and
    introducing NH$_3$ into the plasma, so that a ratio R is greater than 0.95 and less than 1.00, where R is defined as, $$R = \frac{\text{flow of N}_2}{\text{flow of N}_2 + \text{flow of NH}_3}$$

wherein the plasma yields on a substrate the silicon nitride film.

2. The process according to claim 1, wherein the silicon nitride film has an index of refraction greater than 1.97, and wherein R is between 0.97 and 0.99.

3. The process according to claim 1, wherein the silicon nitride film has an optical gap greater than 5 eV, and wherein R is between 0.95 and 0.97.

4. The process according to claim 1, wherein the temperature of the substrate onto which the silicon nitride film is deposited is less than 400° C.

5. The process according to claim 1, wherein a proportion of SiH$_4$ relative to helium is less than 5%.

6. The process according to claim 1, wherein the frequency of the alternating field is between 10 and 400 kHz.

7. The process according to claim 6, wherein the frequency of the alternating field is 50 kHz.

8. The process according to claim 1, further comprising:
    fabricating a flat screen incorporating the silicon nitride film, including engraving transistors on the flat screen, wherein glass in the flat screen is protected from attack by the silicon nitride film during the engraving of said transistors.

* * * * *